United States Patent [19]
Rodder

[11] Patent Number: 5,264,385
[45] Date of Patent: Nov. 23, 1993

[54] SRAM DESIGN WITH NO MOAT-TO-MOAT SPACING

[75] Inventor: Mark S. Rodder, University Park, Tex.

[73] Assignee: Texas Instruments Incorporated, Dallas, Tex.

[21] Appl. No.: 805,393

[22] Filed: Dec. 9, 1991

[51] Int. Cl.⁵ .................. H01L 21/70; H01L 27/00
[52] U.S. Cl. ....................... 437/52; 437/50; 437/57; 437/59; 437/191; 257/379; 257/382; 257/386
[58] Field of Search .............. 437/41, 44, 52, 48, 437/55, 56, 193, 192, 194, 195, 43; 357/23.5; 365/185, 190, 184–185; 257/301–306

[56] References Cited
U.S. PATENT DOCUMENTS

| | | | |
|---|---|---|---|
| 4,408,385 | 10/1983 | Mohan Rao et al. | 437/52 |
| 4,416,049 | 11/1983 | McElroy | 437/195 |
| 4,774,203 | 9/1985 | Ikeda et al. | 437/52 |
| 4,804,636 | 2/1989 | Groover, III et al. | 437/52 |
| 5,057,898 | 10/1991 | Adan et al. | 365/154 |
| 5,100,817 | 3/1992 | Cederbaum et al. | 437/41 |
| 5,114,879 | 5/1992 | Madan | 437/195 |
| 5,124,774 | 6/1992 | Godinho et al. | 365/154 |
| 5,134,581 | 7/1992 | Ishibashi et al. | 365/156 |
| 5,162,889 | 11/1992 | Itomi | 365/154 |

FOREIGN PATENT DOCUMENTS

| | | | |
|---|---|---|---|
| 59-54260 | 3/1984 | Japan | 437/52 |
| 1-144655 | 6/1989 | Japan | 437/52 |
| 3-312271 | 12/1990 | Japan | 437/52 |

Primary Examiner—Olik Chaudhuri
Assistant Examiner—H. Jey Tsai
Attorney, Agent, or Firm—Rebecca A. Mapstone; James C. Kesterson; Richard L. Donaldson

[57] ABSTRACT

A novel layout performing SRAM cells is disclosed wherein conductive straps (36) connect first and second driver gates (22, 24) to second and first drains (33, 31) respectively without connecting the moat of one cell with the moat of another cell such that the conductive straps are never in a DC current path.

9 Claims, 4 Drawing Sheets

SRAM DESIGN WITH NO MOAT-TO-MOAT SPACING

FIELD OF THE INVENTION

This invention generally relates to a novel SRAM cell, static random access memory cell, design which has no intra-cell moat-to-moat spacing and also discloses a two poly level 4T-2R (4 transistor-2 resistor) SRAM cell.

BACKGROUND OF THE INVENTION

Two types of memory cell, the resistive load cell or the stacked 4T-2R cell, and the CMOS (complementary metal oxide semiconductor) cell or stacked 6T (transistor) cell, have been widely used in the VLSI SRAMs. Schematics of a stacked 6 T cell and a stacked 4T-2R cell are shown in FIGS. 1 and 2 respectively. Both the stacked 6T cell and the stacked 4T-2R cell of FIGS. 1 and 2 comprise two pass transistors 30 and two driver transistors 31.

Specific characteristics of these driver and pass transistors in addition to layout dimensions, such as those seen in FIG. 3, can in part determine the performance of the SRAM cell. For example, the $\beta$ ratio of a memory cell, which is one of the factors determining the stability of the cell, is a function of the width and length of the driver and pass transistor gates as shown below:

$$\beta = \frac{W_D}{W_P} \cdot \frac{L_P}{L_D}$$

A high $\beta$ ratio reduces the soft error rate thereby improving the stability of the SRAM cell. The soft error rate is a measure of how easily the data stored in the cell can be altered in the presence of ionizing radiation. In other words, the soft errors refer to an upset or change of state of the cell typically due to ionizing alpha particles.

The length of the driver gate 22,24 shown in FIG. 3 is determined by length $L_D$ and the patterned driver gate electrode and is usually a minimum for a given technology. The width of the pass transistor Wp is determined by the width of the patterned moat region and is also usually a minimum for a given technology. To maximize $\beta$, it is then desired to maximize either $W_D$ or Lp. However, Lp is constrained since the pass transistor must provide for adequate current carrying capability. Thus, a large value of driver moat width $W_D$ is desired.

In FIG. 4, a large value driver moat width $W_D$ can be achieved for a given cell size for which no intra-cell moat-to-moat limitation is apparent. This is unlike prior art in FIG. 3 for which the width of the driver moat $W_D$ must be reduced to simultaneously maintain adequate moat-to-moat spacing 19.

In the fabrication of high density SRAMS, for example the one shown in FIG. 3, there are always concerns regarding intra-cell moat-to-moat spacing 19 due to isolation requirements. Moat-to-moat spacing 19 may be critical to maintain leakage currents at a minimum and to reduce overall the amount of moat-to-moat interaction. Therefore, the driver moat width $W_D$ is limited to meet the spacing requirements, having an adverse effect on the $\beta$ ratio. As cell area is reduced to, for example, 20 $\mu m^2$, the moat-to-moat spacing 19 is typically reduced to $\leq 0.6$ $\mu m$ for conventional SRAM designs.

SUMMARY OF THE INVENTION

To alleviate strict moat-to-moat spacing 19, or n+—n+ minimum isolation width, requirements, while maintaining a high $\beta$ ratio, a novel SRAM cell is designed for which there are no moat-to-moat spacings 19 in the intra-cell region. As such, high density SRAM cells can be fabricated with relaxed isolation technology.

Another advantage of Applicant's invention is that the interconnects connecting a driver moat region, e.g. 21, to an opposite driver gate (e.g. 24) are not in a DC current path, thus improving cell stability.

Another advantage of Applicant's invention is the flexibility of SRAM cell layout provided by using two word lines per cell.

Another advantage of Applicant's invention is the ease of fabrication of a complete 4T-2R SRAM cell, including load elements such as resistors, requiring only two polysilicon levels. Other advantages of this structure include symmetry, high $\beta$ ratio and formation of an interconnect which need not have extremely low contact or strap resistance.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 4:
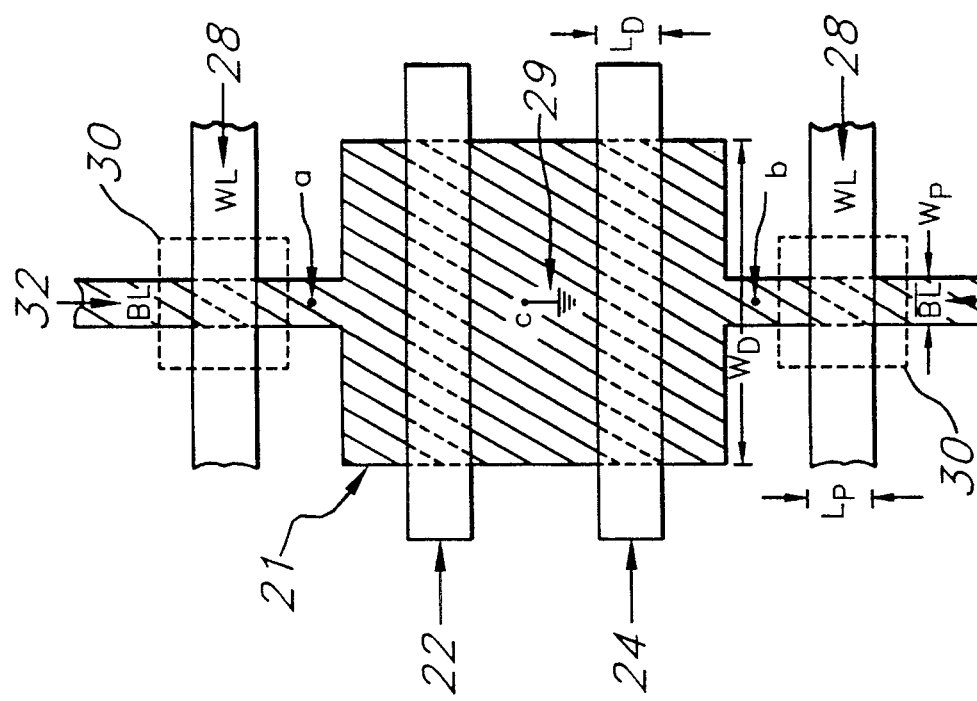
FIG. 4 is a structure layout of an SRAM cell according to a preferred embodiment of Applicants invention.

A preferred embodiment of Applicants SRAM continuous moat cell layout is shown in FIG. 4. The process flow is summarized in FIG. 7. First, the field oxide 20 is formed using a LOCOS process, thereby defining the moat 21. A gate insulator 23 is then formed. Next, the polysilicon gates 22,24 are deposited, patterned and etched and implantation of n+ using the poly Si gates as a mask, forms lightly doped drain and source regions or LDDs 25. Sidewall oxide spacers 27 are next formed on either side of the poly Si gates 22,24 to mask the LDD regions 25 from the heavy implantations of n+ in the source 29 and drain 31,33 regions as the source and drain regions are formed. The two source regions 29 adjacent to the driver gates 22,24 are connected together and later will be connected to ground through a contact. The two word lines 28 can be deposited, patterned and etched in the same process step that the poly Si gates 22,24 are deposited, patterned and etched. The bit line 32 and bit line bar 34 contacts are at opposite ends of the SRAM cell. The bit line and bit line bar are often formed of metal later in the formation of the SRAM cell. Although polysilicon is the conductive material used in describing the process flow of the device, it is well known in the art that other appropriate conductive materials could be used in the alternative.

Figure 3:
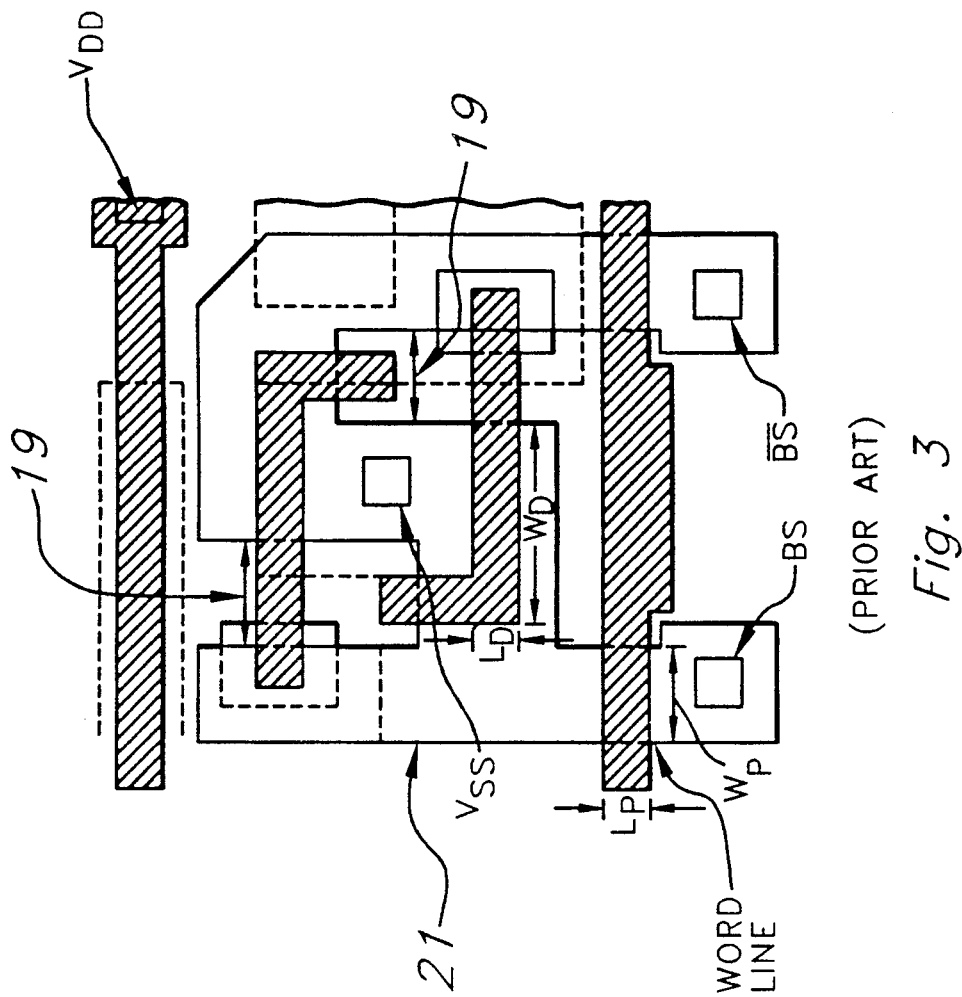
FIG. 3 is a structure layout of a prior art SRAM cell.
Figure 1:
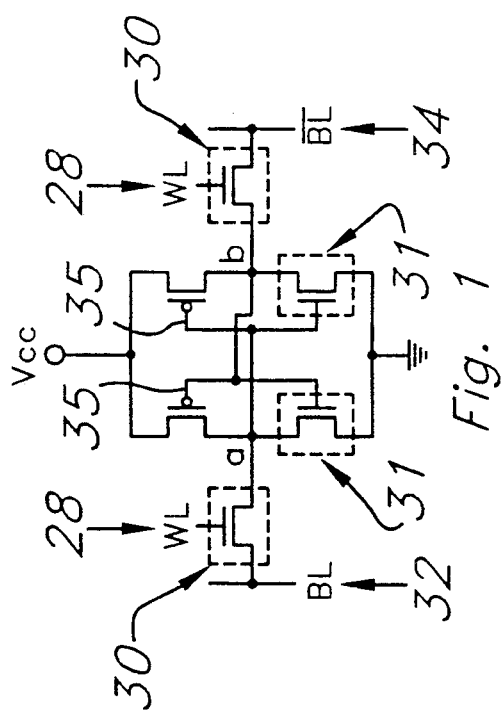
FIG. 1 is a schematic diagram of a stacked 6T (transistor) SRAM cell.
Figure 2:
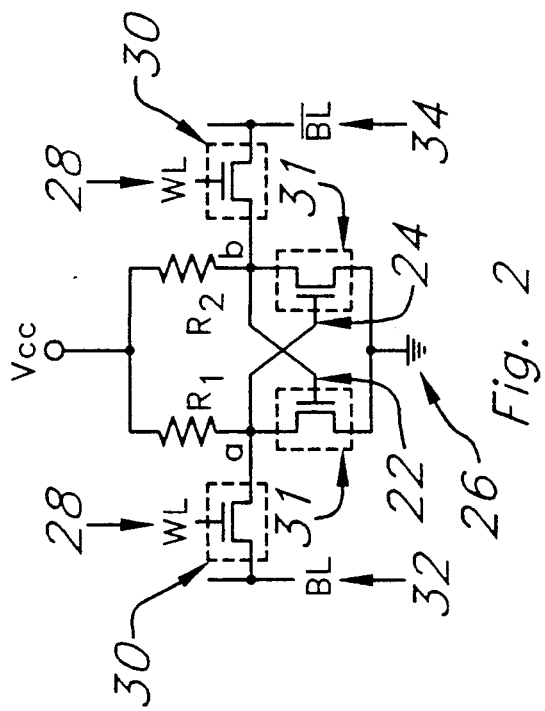
FIG. 2 is a schematic diagram of a stacked 4T (transistor)-2R (resistor) SRAM cell.

All of the above processing steps describe the formation of the pass and driver transistors as well as the word lines of FIGS. 1 or 2, without the connections between them. Therefore, FIG. 4, although it only shows the moat 21, the poly Si driver gates 22,24 and the word lines 28, a source 29, drain 31,33 and LDD regions 25 shown in FIG. 7 have been formed and exist by this step in the flow.

Figure 6:
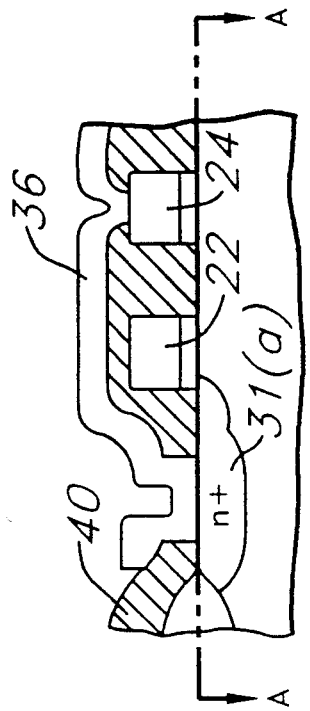
FIG. 6 is a cross-sectional view of FIG. 5 along the lines A—A', showing the conductive strap using one method of introducing an insulator.
Figure 5:
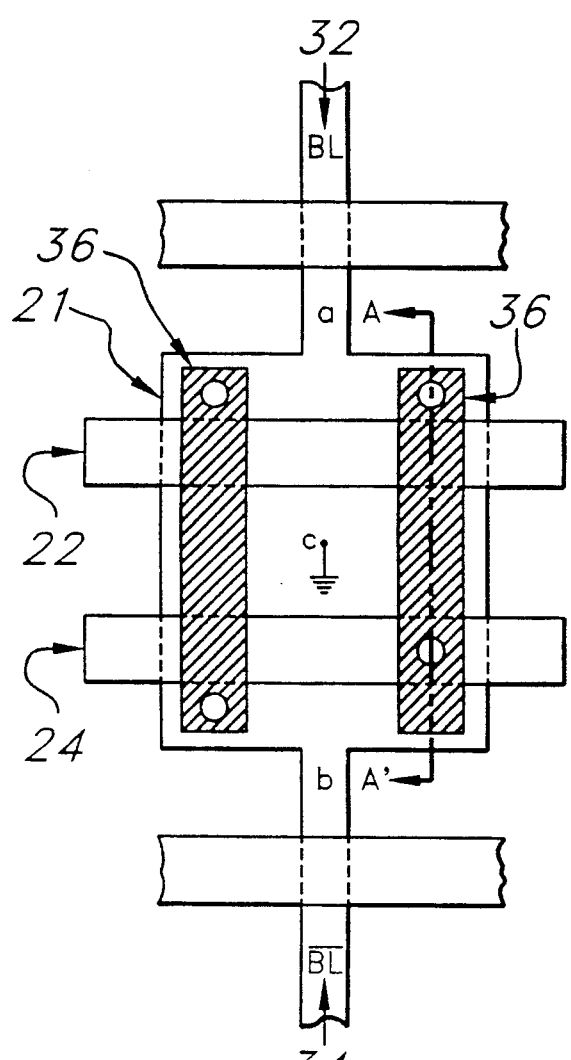
FIG. 5 is a structural layout of the next process step of the structure of FIG. 4 which shows the formation of the conductive straps with which the driver gates are connected to nodes a and b.

Now, according to FIG. 2, the driver gates 22,24 must be connected to the desired nodes a and b. FIG. 5 illustrates the straps, 36, through which a contact hole connects driver gate 22 to node point b and driver gate 24 to node region a. The cross sectional view of strap 36 is shown in FIG. 6.

Figure 7:
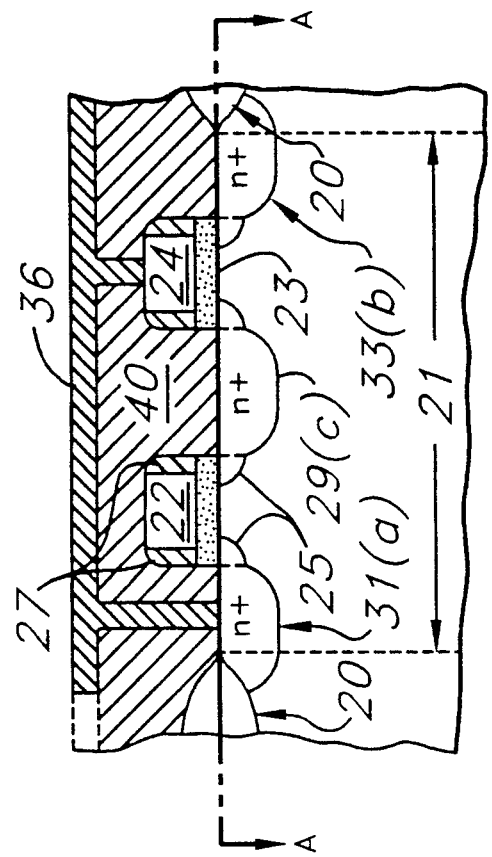
FIG. 7 is a cross-sectional view of FIG. 5 along the lines A—A', showing the conductive strap using a planarized insulation layer.
Figure 11:
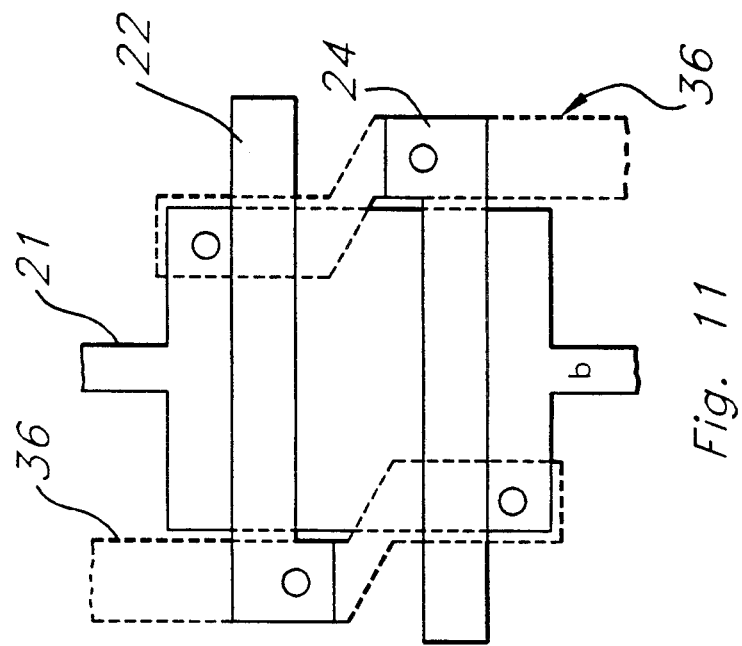
FIG. 11 is a structural layout of another alternative process step of the structure of FIG. 5 which forms the gate contacts beyond the moat.

An insulator 40 is deposited, masked and etched to allow access to the gate 24 and the moat 21 at the node region a. Then the contacts through the insulating layer will be formed. If insulator 40 is planarized prior to etching of contacts through the insulator, a two mask process can be used to form a contact hole to region 31 and separately, a contact hole to region 24. Another alternative method is the formation of the gate contact beyond the moat region 21 as shown in FIG. 11. This removes the potential for inadvertently connecting one moat to another and also shorting the gate to both moats. Finally, a material layer is deposited, masked and etched and to form the interconnect strap 36 which connects the driver gate 24 to moat node point a. A second cross sectional view of the interconnect strap 36 and the contact holes within that strap is shown in FIG. 7 using a planarized insulator.

Figure 8:
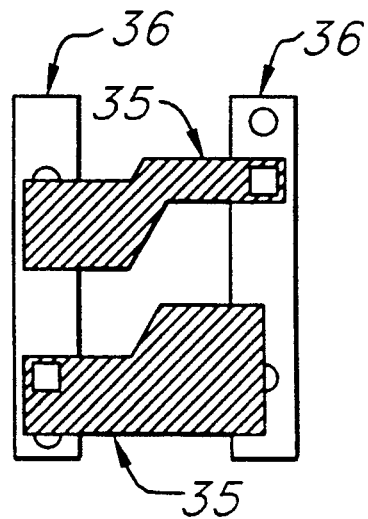
FIG. 8 is a structural layout of the next process step of the structure of FIG. 5 if you are forming the SRAM cell in FIG. 1.

If a stacked 6T cell is formed as shown in FIG. 1, the next step in the process flow is the formation of the PMOS gates 35. FIG. 8 will show this step from the strap up. Another layer of insulator is deposited, patterned and etched. Then, again the contact hole through another insulator connects the PMOS gate 35 to an underlying strap 36. Finally, the PMOS gate material 50 is deposited, patterned and etched to overlay a small area of one interconnect strap and a larger area of the second strap as shown in FIG. 8. The filled in squares represent the contact holes through the last applied insulator which connects the PMOS gates 35 to the underlying interconnect straps 22,24.

Figure 10:
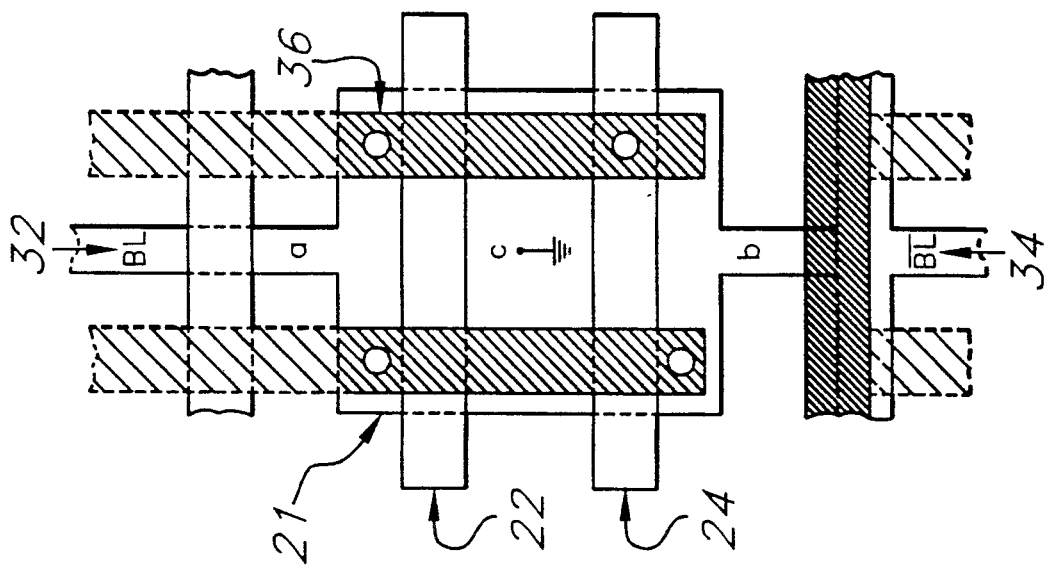
FIG. 10 is a structural layout an alternative process step of the structure FIG. 5 which includes the load elements in the same material as the conductive straps.

In a second embodiment, at the same process step that the interconnect straps are formed, the resistors of FIG. 2 could also be formed as shown in FIG. 10. Instead of patterning and etching for the interconnect straps alone, extend the polysilicon beyond one end of the moat to the very edge of the cell. On the other end of the moat, a stretch of polysilicon, which overlies the word line 28, can be deposited, patterned and etched simultaneously with the interconnect straps to form a power bus line, with polysilicon runners lying in line with the stretch of polysilicon extended out towards the other end of the cell, as shown in FIG. 10. The polysilicon which overlies the word line and the interconnect straps can then be heavily doped, e.g., via implantation, as represented with dark cross-hatching, for maximum conductivity. In addition, the lightly cross-hatched areas are undoped or lightly doped to provide adequate resistance. In this way, the second level of polysilicon serves as the interconnect as well as the resistor load. This layout of SRAM cell is able to be arrayed in the vertical or the lateral direction. This cell is compatible with the needs for an ASIC SRAM cell of approximately 40 $\mu m2$. Additionally, this cell allows for much reduced complexity in regards to other cell designs.

Figure 9:
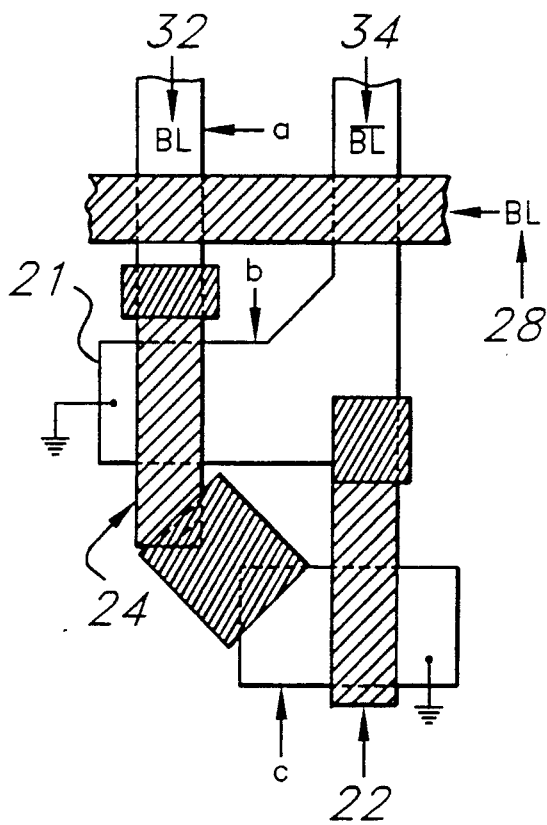
FIG. 9 is a structural layout of another prior art conventional cell.
Figure 12:
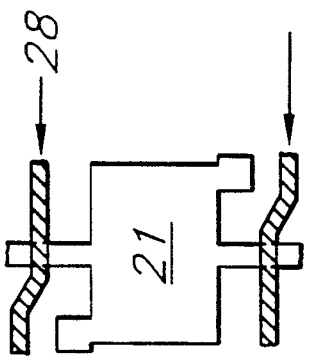
FIG. 12 is a structural layout of yet another preferred embodiment.

One advantage of a preferred embodiment of Applicant's invention is that the interconnect straps formed never connect one moat to any other moat and thus the straps ar never in a DC current path. For example, FIG. 9 is the layout of a prior art conventional cell. The moat regions 21a, 21b, and 21c, are shown without hashmarks. The driver gates 22,24 and pass gates 28 are designated by the lightly cross-hatched areas and the heavily cross-hatched areas are the interconnect straps 36 As is evident from the layout, the path from bit line to ground must traverse two interconnects which connect two different moats. Keeping these interconnect straps from being in DC current paths improves static noise margin, cell symmetry and the cell stability.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. Other devices, systems and methods are also disclosed.

What is claimed is:

1. A method of forming SRAM cells comprising the steps of:
    forming first and second drains located within a moat area formed in a substrate, and forming a source located between and separated from said first and second drains;
    forming a first elongated driver gate located between said first drain and said source, and forming a second elongated driver gate parallel to said first elongated driver gate and located between said second drain and said source;
    forming a first word line outside of said moat area and extending parallel to said first elongated driver gate, and forming a second word line outside of said moat area extending parallel to said first word line, said first and second driver gates located between said first word line and said second word line, forming a first conductive strap connecting said first driver gate to a first selected region of said moat area, and forming a second conductive strap connecting said second driver gate to a second selected region of moat area, forming an insulator separating said first and second conductive straps from said first and second driver gates and said one and another regions, and planarizing said insulator and forming said conductive straps to extend across said planarized insulator.

2. The method of claim 1 wherein said first selected region is said first drain and said step of forming said first conductive strap comprises the step of forming said first conductive strap to connect said first drive gate to said first drain.

3. The method of claim 2 wherein said second selected region is said second drain and said step of forming said second conductive strap comprises the step of forming said second conductive strap to connect said second drain gate to said second drain.

4. The method of claim 1 and further comprising the steps of forming an insulated layer covering said first and second conductive straps and forming first and second PMOS gates over said insulator layer, electrically connecting said first conductive strap and said first PMOS gate and electrically connecting said second conductive strap with said second PMOS gate by means of apertures defined in said insulating layer, overlying a portion of said second conductive strap with said first PMOS gate, and overlying said first conductive strap with said second PMOS gate.

5. The method of claim 1, wherein said step of forming said first and second conductive straps comprises the step of forming polysilicon straps and heavily doping said straps where said straps overlie said moat area, such that said straps are conductive.

6. The method of claim 5 and further including the step of forming a conductive power bus line overlying at least one of said word lines.

7. The method of claim 6, further comprising the step of extending said polysilicon straps beyond said moat area and crossing over said second word line so as to contact said formed power bus line, and lightly or not doping said strap beyond said moat area, such that said strap is resistive.

8. A method of forming an SRAM cell comprising the steps of:

defining a moat area in a substrate having one region and another region, at opposite ends of said moat;

depositing an oxide layer to at least cover selected portions of said moat area;

depositing, patterning and etching of polysilicon to form a first and second word line, and over said selected portion to form a first and second gate to define drain and source regions;

doping said source and drain regions with a dopant of a first conductivity type;

depositing, patterning, etching and planarizing an insulator material defining a first hole extending between said one region to said first gate, and a second hole extending between said another region to said second gate; and depositing, patterning and etching a material layer to form a first interconnect strap connecting said one region to said first gate and a second interconnect strap connecting said another region to said second gate.

9. A method of forming SRAM cells comprising the steps of:

forming first and second drains located within a moat area formed in a substrate, and forming a source located between and separated from said first and second drains;

forming a first elongated driver gate located between said first drain and said source, and forming a second elongated driver gate parallel to said first elongated driver gate and located between said second drain and said source;

forming a first word line outside of said moat area and extending parallel to said first elongated driver gate, and forming a second word line outside of said moat area extending parallel to said first word line, said first and second driver gates located between said first word line and said second word line;

forming a first conductive strap connecting said first driver gate to a first selected region of said moat area, and forming a second conductive strap connecting said second driver gate to a second selected region of moat area;

forming a first set of contacts connecting to said first driver gate and said first selected region of said moat area, and;

forming a second set of contacts connecting said second driver gate to said second selected region of said moat area, wherein both sets of contacts lie within said moat area.

* * * * *